(12) United States Patent
Lin et al.

(10) Patent No.: US 7,466,205 B1
(45) Date of Patent: Dec. 16, 2008

(54) ULTRA-WIDEBAND LOW NOISE AMPLIFIER AND AMPLIFICATION METHOD THEREOF

(75) Inventors: Yu Tso Lin, Taipei (TW); Shey Shi Lu, Taipei (TW)

(73) Assignee: National Taiwan University, Taipei (TW)

( * ) Notice: Subject to any disclaimer, the term of this patent is extended or adjusted under 35 U.S.C. 154(b) by 63 days.

(21) Appl. No.: 11/765,740

(22) Filed: Jun. 20, 2007

(51) Int. Cl.
*H03F 3/04* (2006.01)
(52) U.S. Cl. .......................... 330/310; 330/98
(58) Field of Classification Search ................. 330/310, 330/150, 98
See application file for complete search history.

(56) References Cited

U.S. PATENT DOCUMENTS

| | | | | |
|---|---|---|---|---|
| 3,434,070 A | * | 3/1969 | Bartnik et al. | 330/305 |
| 4,453,132 A | * | 6/1984 | Stamler | 330/107 |
| 4,495,429 A | * | 1/1985 | Oda et al. | 327/327 |
| 4,559,503 A | * | 12/1985 | Camand et al. | 330/302 |

OTHER PUBLICATIONS

A 3-10-GHz low-noise amplifier with wideband LC-ladder matching network, Aly Ismail et al., IEEE Journal of Solid-State Circuits, vol. 39, No. 12, Dec. 2004.
An ultra-wideband CMOS low-noise amplifier for 3.1-10.6-GHz wireless receivers, Andrea Bevilacqua, IEEE Journal of Solid-State Circuits, vol. 39, No. 12, Dec. 2004.
A 1-GHz BiCMOS RF front-end integrated circuit, Robert G. Meyer et al., IEEE Journal of Solid-State Circuits, vol. 29, No. 3, Mar. 1994.

* cited by examiner

*Primary Examiner*—Henry K Choe
(74) *Attorney, Agent, or Firm*—Rabin & Berdo, P.C.

(57) ABSTRACT

An ultra wideband low noise amplifier (UWB LNA) and amplification method thereof, providing a substantially achieved bandwidth extension by pole-zero cancellation and utilized to transform input impedance matching up to 50 ohm for gaining low noise figure. The ultra-wideband low noise amplifier is composed of a capacitive-feedback amplifier, a resistive-feedback amplifier, an inductive-feedback amplifier, and a buffer amplifier.

24 Claims, 11 Drawing Sheets

| | Tech | Maximum $V_{DD}$(V) | Input matching BW(GHz) | Peak $S_{21}$(dB) | 3-dB BW of $S_{21}$(GHz) | Minimum NF(dB) | Max. Group delay variation (ps) | $P_{1dB}$ (dBm) | IIP3 (dBm) | Power Comsumption (mW) |
|---|---|---|---|---|---|---|---|---|---|---|
| This work | 0.35 μm SiGe | 1.7 | 3-14 | 26.1 | 3-11.6 | 2.5 | ±28 | -26* | -17* | 26 |
| (1) | 0.18 μm SiGe | 3 | 2.2-8 | 21 | 3-10 | 2.5 | NA | -14.7* | -1* | 30 |
| (2) | 0.18 μm CMOS | 1.8 | 2.6-11.7 | 9.3 | 2.3-9.2 | 4 | ±40 | -15** | -6.7** | 9 |
| (4) | 0.25 μm SiGe | 1 | 4-6 | 10 | 3.4-6.9 | 4.5 | ±30 | -10*** | NA | 3.5 |

* at 5.5 GHz   at 6 GHz  * at 5 GHz

FIG. 13

ULTRA-WIDEBAND LOW NOISE AMPLIFIER AND AMPLIFICATION METHOD THEREOF

FIELD OF THE INVENTION

The present invention relates to an amplifier, and more particularly, to an ultra-wideband low noise amplifier and amplification method thereof.

BACKGROUND OF THE INVENTION

Traditionally, the input impedance matching of low noise amplifier is transformed through inductor feedback. For example, "A 1-GHz BiCMOS RF front-end integrated circuit", published in IEEE Journal of Solid-State Circuits, 1994, described that the amplifier circuits were designed through the method of inductor feedback, and the methodology was extensively used to design different low noise amplifiers. In addition, "A 3-10 GHz low-noise amplifier with wideband LC-ladder matching network", published in IEEE Journal of Solid-State Circuits, 2004, also demonstrated that the method of inductor feedback was adopted for generating input impedance matching to 50 ohm to gain low noise figure.

Furthermore, input impedance matching for forming ultra-wideband could be transformed through the passive filter theory, and a plurality of inductors are used to reach impedance matching for ultra wideband. For instance, "An ultra-wideband CMOS low-noise amplifier for 3.1-10.6 GHz wireless receivers", published in IEEE Journal of Solid-State Circuits 2004, showed that it was necessary to dispose a plurality of inductors in an amplifier for matching input impedance according to the passive filter theory. On the other hand, the more inductors are disposed in an amplifier, the higher noise figure is generated, and the bulky chip is also needed for installing plenty of inductors. Accordingly, it is difficult in chip designs and product applications.

SUMMARY OF THE INVENTION

According to the prior arts mentioned above, the present invention is provided with an ultra-wideband low noise amplifier (UWB LNA) that is able to generate low noise figure, high gain bandwidth and micro chips. So it is very helpful to develop the ultra-wideband communication product and the microminiaturization of ultra-wideband products.

The primary objective of the present invention is to provide an ultra-wideband low noise amplifier with four cascaded stages. The circuit structure of the ultra-wideband low noise amplifier comprises a capacitive-feedback amplifier, a resistive-feedback amplifier, an inductive-feedback amplifier, and a buffer amplifier, wherein the basic configuration of the four amplifiers is a common-emitter amplifier, and each of which includes a transistor taken as active component. The resistive-feedback amplifier is connected to the output of capacitive-feedback amplifier, and the inductive-feedback amplifier is connected to the output of resistive-feedback amplifier. Besides, the buffer amplifier is connected to the output of the inductive-feedback amplifier. Thus, the four amplifiers are cascaded to form the ultra-wideband low noise amplifier for low noise figure and bandwidth extension.

Another objective of the present invention is to provide a method for transforming the ultra wideband low noise amplifier, and the steps comprise matching input impedance and extending bandwidth. In the first step, matching input impedance, the capacitive-feedback amplifier mentioned above is utilized for matching input impedance up to 50 ohm to gain low noise figure. In the second step, extending bandwidth, connecting a resistive-feedback amplifier to the output of capacitive-feedback amplifier, connecting an inductive-feedback amplifier to the output of resistive-feedback amplifier, and connecting a buffer amplifier to the output of inductive-feedback amplifier are adopted to form the UWB LNA circuit for pole-zero cancellation to extend bandwidth. By this method, the ultra-wideband low noise amplifier of the present invention is provided to generate low noise figure and high gain bandwidth.

As above, the ultra-wideband low noise amplifier of the present invention is provided with four cascaded stages, wherein the first stage is the capacitive-feedback amplifier with a transistor that is taken as active component. The collector of transistor is connected to the power via a loading resistor, and the emitter is ground. In addition, the base of the transistor is connected to the input of the capacitive-feedback amplifier via an inductor, while the collector connected to the output of the capacitive-feedback amplifier via a capacitor. Besides, a feedback capacitor is disposed between the base and collector of the transistor.

Then, the second stage is the resistive-feedback amplifier with a transistor that is taken as active component. The base of the transistor is connected to the output of capacitive-feedback amplifier, and the collector is connected to the power via a loading resistor. Moreover, the emitter of the transistor is ground, and the collector is connected to the output of the resistive-feedback amplifier via a capacitor. Additionally, a feedback resistor is disposed between the base and collector of the transistor.

Subsequently, the third stage is the inductive-feedback amplifier with a transistor that is taken as active component. The base of the transistor is connected to the output of resistive-feedback amplifier, and the collector is connected to the power via a loading resistor. Furthermore, the emitter of the transistor is ground, and the collector is connected to the output of the inductive-feedback amplifier via a capacitor. Besides, a feedback inductor is disposed between the base and collector of the transistor.

At last, the fourth stage is the buffer amplifier with a transistor that is taken as active component. The base of the transistor is connected to the output of inductive-feedback amplifier, and the collector is connected to the power via a loading inductor. Additionally, the emitter of the transistor is ground, and a feedback resistor is disposed between the base and collector of the transistor. Furthermore, the collector of the transistor is taken as the output of the buffer amplifier.

Consequently, the ultra-wideband low noise amplifier of the present invention is composed of only a few inductors and other electronic components. Thus, the present invention is provided to avoid disposing too many inductors on a chip, by this way, the shortcoming of bulky chip is overcome.

Furthermore, the ultra-wideband low noise amplifier is applied in ultra wideband communication product or wireless communication network, and the amplifier is manufactured by complementary Metal-Oxide-Semiconductor (CMOS) process, Si-Bipolar process, Bi-CMOS process, Metal-Semiconductor Field Effect Transistor (MESFET) process, pseudomorphic High Electron Mobility Transistor (pHEMT) process or Heterostructure Bipolar Transistor (HBT) process.

As above, the ultra-wideband low noise amplifier is provided with four cascaded stages which are the capacitive-feedback amplifier, resistive-feedback amplifier, inductive-feedback amplifier, and buffer amplifier. The active components of the four amplifiers are transistors, wherein the transistor is n-type metal oxide semiconductor field-effect transistor (n-MOSFET), p-type metal oxide semiconductor field-effect transistor (p-MOSFET), Bipolar Junction Transistor (BJT), MESFET, pHEMT or HBT.

Additionally, there are capacitors disposed respectively in the first, second and third stage i.e. the capacitive-feedback amplifier, resistive-feedback amplifier and inductive-feedback amplifier, wherein the capacitor is a Metal-Insulator-Metal Capacitor (MIM Capacitor), PN Junction Capacitor or Metal-Oxide Semiconductor Capacitor (MOS Capacitor).

Moreover, there are resistors and inductors installed in the four stages, wherein the resistor is a polysilicon resistor or N-well resistor, and the inductor is disposed on chip or a metal wire inductor linked to chip externally.

BRIEF DESCRIPTIONS OF THE DRAWINGS

The foregoing aspects, as well as many of the attendant advantages and features of this invention will become more apparent by reference to the following detailed description, when taken in conjunction with the accompanying drawings, wherein.

DETAILED DESCRIPTIONS OF THE PREFERRED EMBODIMENT

In the present invention, the preferred embodiment to implement an ultra-wideband low noise amplifier is demonstrated by a 0.35 μm SiGe HBT process.

Figure 1:
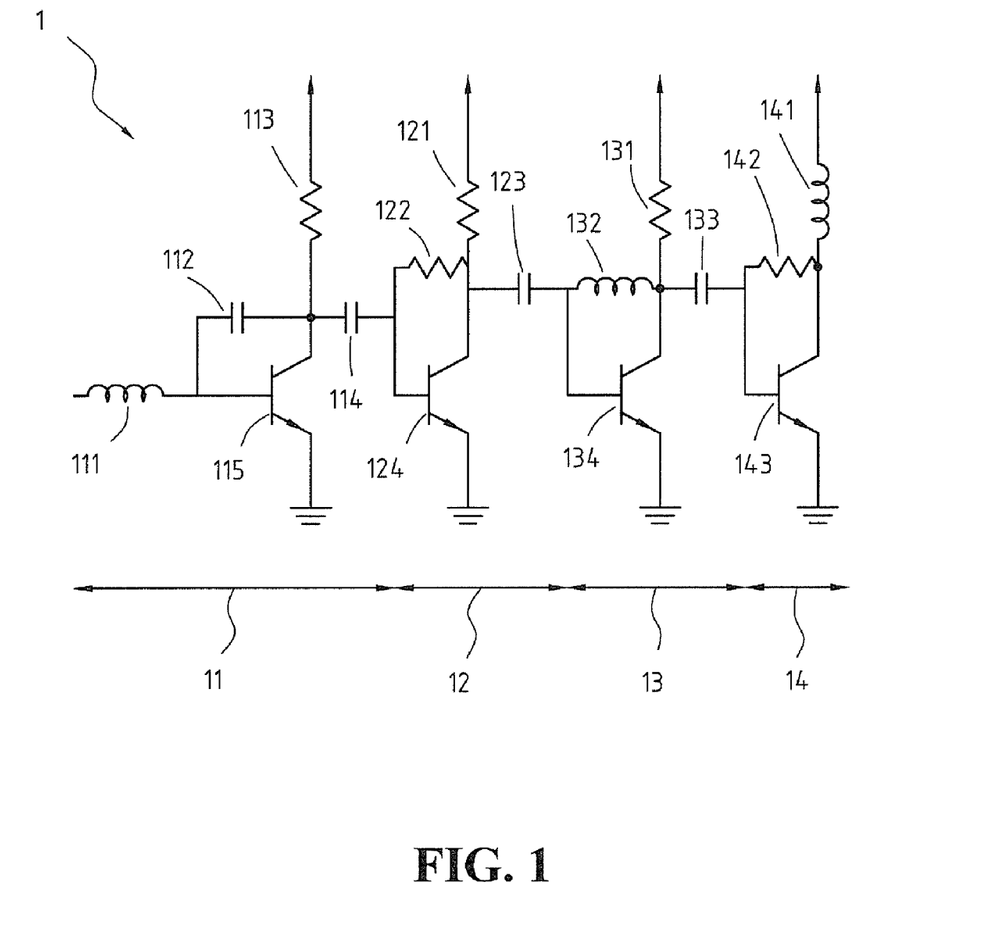
FIG. 1 illustrates the circuit diagram of the ultra-wideband low noise amplifier.

Referring to FIG. 1 to illustrate the circuit diagram of the ultra-wideband low noise amplifier. The ultra-wideband low noise amplifier 1, a circuit structure with four cascaded stages, comprises a capacitive-feedback amplifier 11, a resistive-feedback amplifier 12, an inductive-feedback amplifier 13, and a buffer amplifier 14, wherein the basic configuration of the four amplifiers is a common-emitter amplifier, and each of which includes a transistor taken as active component. The resistive-feedback amplifier 12 is connected to the output of capacitive-feedback amplifier 11, and the inductive-feedback amplifier 13 is connected to the output of resistive-feedback amplifier 12. Besides, the buffer amplifier 14 is connected to the output of the inductive-feedback amplifier 13. Thus, the four amplifiers are cascaded to form the ultra-wideband low noise amplifier 1 for low noise figure and bandwidth extension.

The first stage amplifier of the ultra-wideband low noise amplifier 1 is the capacitive-feedback amplifier 11, and the capacitive-feedback amplifier 11 is composed of an input matching inductor 111, a feedback capacitor 112, a loading resistor 113, a DC blocking capacitor 114 and a transistor 115, wherein the transistor 115 is a Heterostructure Bipolar Transistor (HBT) and taken as the active component of the capacitive-feedback amplifier 11. The collector of transistor 115 is connected to the power via the loading resistor 113, and the emitter is ground. In addition, the base of the transistor 115 is connected to the input of the capacitive-feedback amplifier 11 via the input matching inductor 111, while the DC blocking capacitor 114 is disposed between the collector and the output of the capacitive-feedback amplifier 11 to block the DC bias of the next stage amplifier. Besides, a feedback capacitor 112 is disposed between the base and collector of the transistor 113.

The second stage amplifier of the ultra-wideband low noise amplifier 1 is the resistive-feedback amplifier 12, and the resistive-feedback amplifier 12 is composed of a loading resistor 121, a feedback resistor 122, a DC blocking capacitor 123 and a transistor 124, wherein the transistor 124 is a HBT and taken as the active component of the resistive-feedback amplifier 12. The base of the transistor 124 is connected to the output of capacitive-feedback amplifier 11, and the collector is connected to the power via the loading resistor 121. Moreover, the emitter of the transistor 124 is ground, and the feedback resistor 122 is disposed between the base and collector of the transistor 124 to raise gain bandwidth. Additionally, the DC blocking capacitor 123 is disposed on the output of the resistive-feedback amplifier 12 to block the DC bias of the next stage amplifier.

The third stage amplifier of the ultra-wideband low noise amplifier 1 is the inductive-feedback amplifier 13, and the inductive-feedback amplifier 13 is composed of a loading resistor 131, a feedback inductor 132, a DC blocking capacitor 133 and a transistor 134, wherein the transistor 134 is a HBT and taken as the active component of the inductive-feedback amplifier 13. The base of the transistor 134 is connected to the output of resistive-feedback amplifier 12, and the collector is connected to the power via a loading resistor 131. Furthermore, the emitter of the transistor 134 is ground, and the feedback inductor 132 is disposed between the base and collector of the transistor 134. Besides, the DC blocking capacitor 133 is disposed between the transistor 134 and the output of the inductive-feedback amplifier 13 to block the DC bias of the next stage amplifier.

At last, the fourth stage amplifier of the ultra-wideband low noise amplifier 1 is the buffer amplifier 14, and the buffer amplifier 14 is composed of a loading inductor 141, a feedback resistor 142 and a transistor 143, wherein the transistor 143 is a HBT and taken as the active component of the buffer amplifier 14. The base of the transistor 143 is connected to the output of inductive-feedback amplifier 13, and the collector is connected to the power via a loading inductor 141. Additionally, the emitter of the transistor 143 is ground, and a feedback resistor 142 is disposed between the base and collector of the transistor 143. Furthermore, the collector of the transistor 143 is taken as the output of the buffer amplifier 14.

The present invention also provides a method for transforming the ultra wideband low noise amplifier 1, comprising the following steps matching input impedance and extending bandwidth. In the first step, matching input impedance, the capacitor-feedback amplifier 11 mentioned above is utilized for matching input impedance up to 50 ohm to gain low noise figure. In the second step, extending bandwidth, connecting a resistive-feedback amplifier 12 to the output of capacitive-feedback amplifier 11, connecting an inductive-feedback amplifier 13 to the output of resistive-feedback amplifier 12, and connecting a buffer amplifier 14 to the output of inductive-feedback amplifier 13 are adopted to form the UWB LNA circuit for pole-zero cancellation to extend bandwidth. By this method, the ultra-wideband low noise amplifier 1 of the present invention is provided to generate low noise figure and high gain bandwidth.

Consequently, the ultra-wideband low noise amplifier 1 of the present invention is composed of only a few inductors and other electronic components to avoid utilizing too many inductors, by this way, the shortcoming of bulky chip is overcome.

Figure 2:
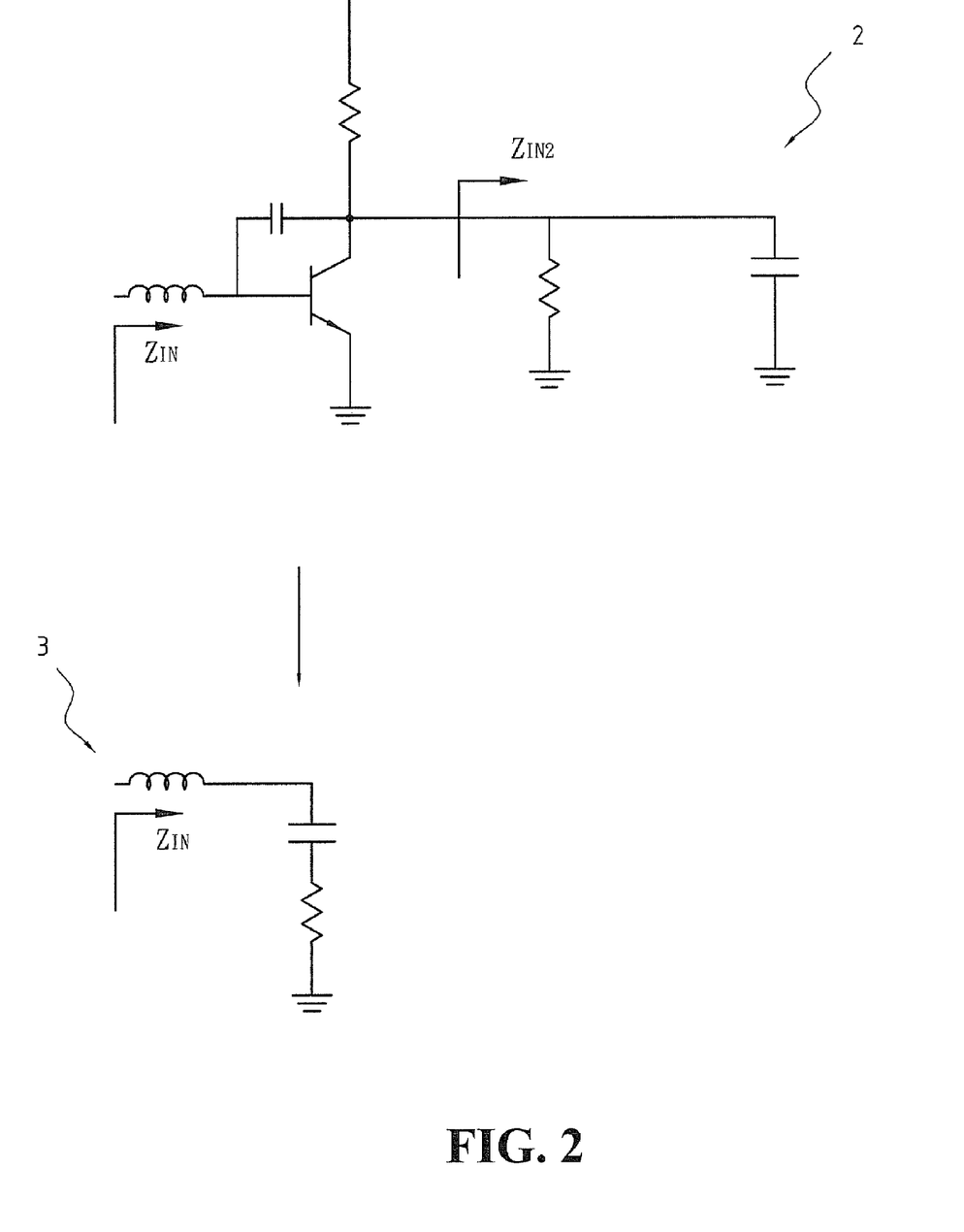
FIG. 2 illustrates the input impedance matching of capacitive feedback.

Subsequently, with reference to FIG. 2 showing the input impedance matching of capacitive feedback to explain the first step of the method. The circuit is the capacitive feedback circuit 2 and the equivalent circuit 3 of the capacitive feedback circuit. In this figure, the input impedance $Z_{IN}$ equals to 50, in other words, the input impedance matching of the capacitive-feedback amplifier is 50 ohm. Thus, the ultra-wideband low noise amplifier of the preferred embodiment is able to generate low noise figure.

Figure 3:
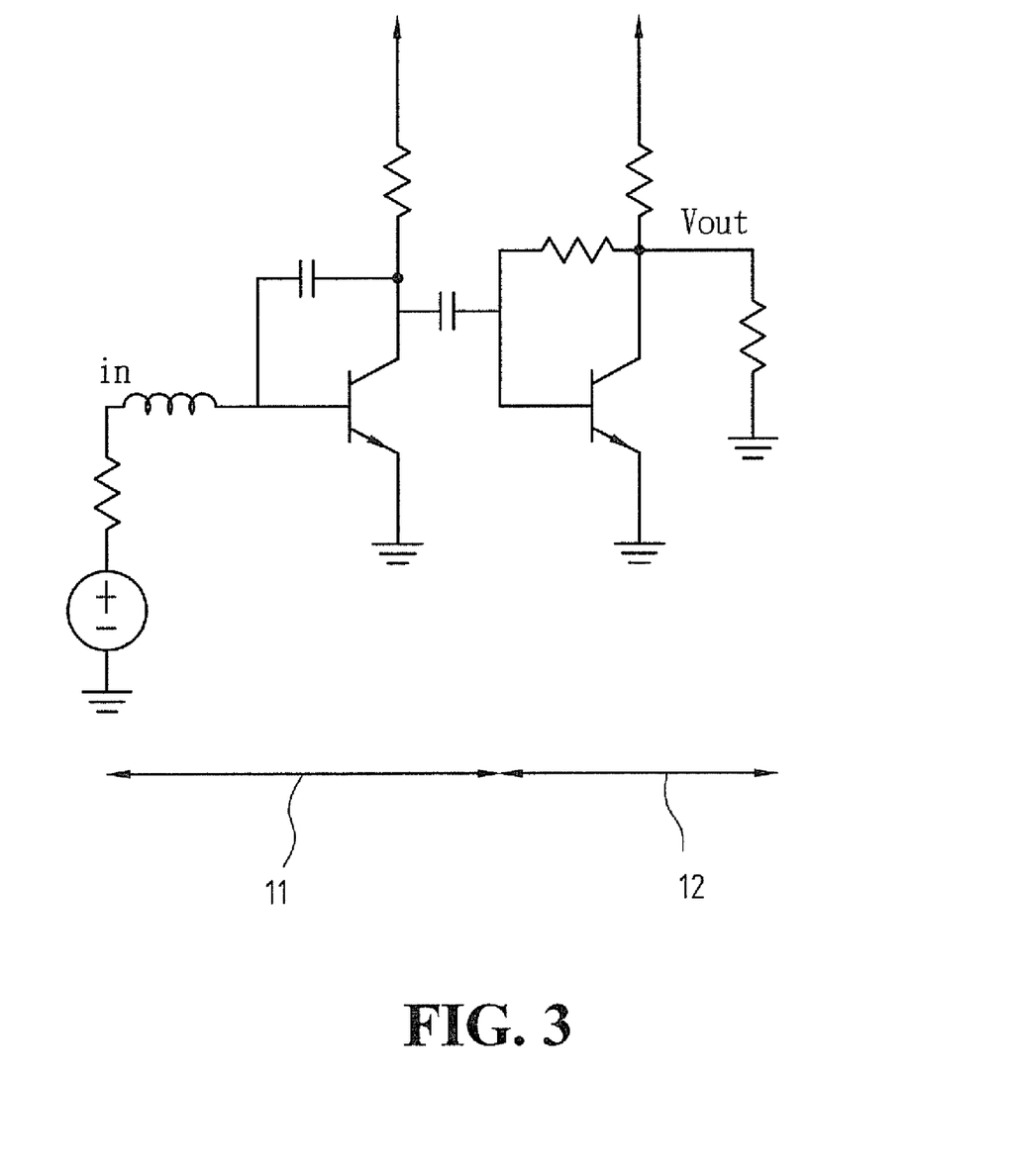
FIG. 3 illustrates the connecting diagram of the capacitive-feedback amplifier and resistive-feedback amplifier.
Figure 4:
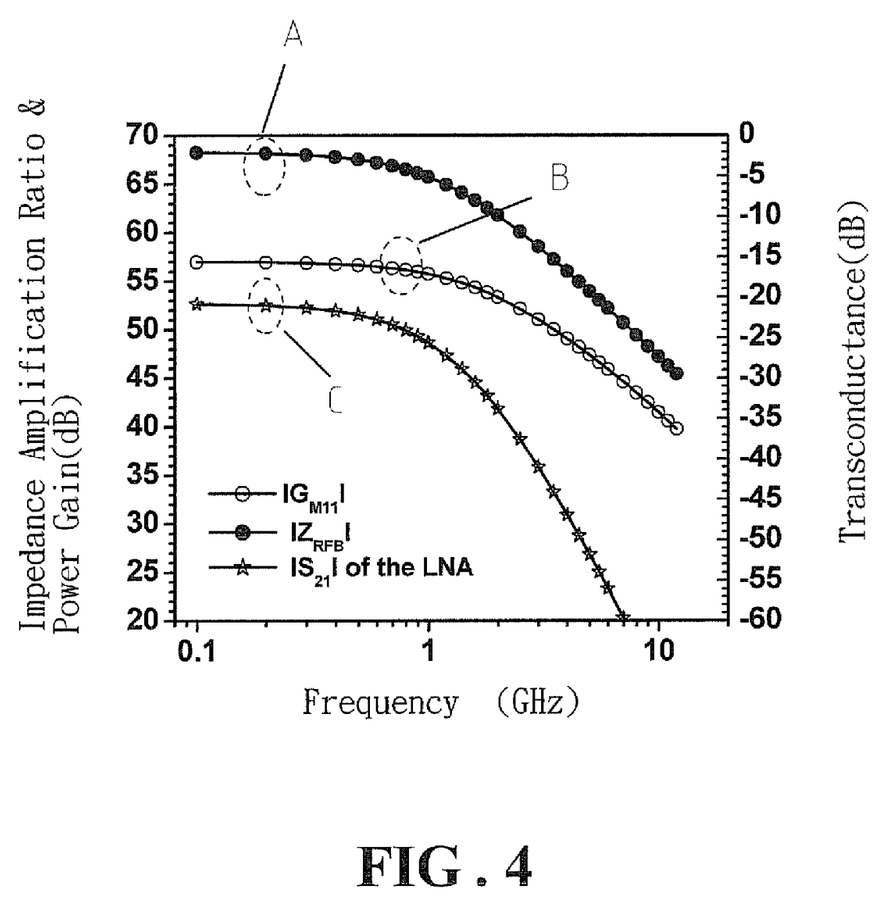
FIG. 4 illustrates the connecting gain characteristic of the capacitive-feedback amplifier and resistive-feedback amplifier.

Referring to FIG. 3 to illustrate the connecting diagram of the capacitive-feedback amplifier and resistive-feedback amplifier. The resistive-feedback amplifier 12 gains the bandwidth of the amplifier 1, and two poles $P_{IN}$ and $P_1$ (unshown) are obtained when the capacitive-feedback amplifier 11 and resistive-feedback amplifier 12 are connected. Next, refer to FIG. 4 illustrating the connecting gain characteristic of the capacitive-feedback amplifier and resistive-feedback amplifier, wherein A, B and C represent the impedance amplification ratio, transconductance and power gain respectively, besides, the pole frequency or corner frequency is less than 1.2 $GH_Z$. As a result, the gain bandwidth of the circuit is not able to reach 3-10 $GH_Z$ and it is necessary to cascade other amplifiers to extend bandwidth.

Therefore, in the preferred embodiment of the present invention, the output of resistive-feedback amplifier is cascaded to the inductive-feedback amplifier, which provides a zero $Z_1$ and three poles $P_2$, $P_3$ and $P_4$. Besides, with reference to FIG. 5 exhibiting the relative position of the zero and poles of the ultra-wideband low noise amplifier, wherein the pole $P_3$ and $P_4$ are complex conjugate roots, and the positions of the zero $Z_1$ and the pole $P_1$ are the same, so the bandwidth is extended by pole-zero cancellation.

Figure 6:
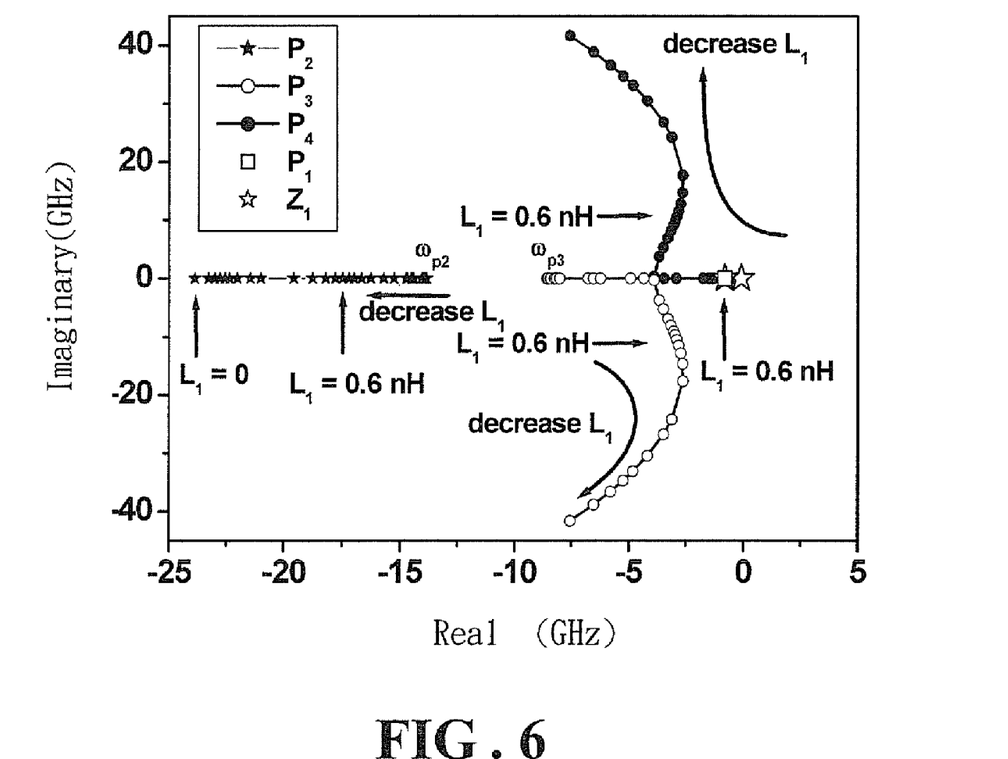
FIG. 6 illustrates the zero and poles analysis of the ultra-wideband low noise amplifier.

Furthermore, FIG. 6 illustrates the zero and poles analysis of the ultra-wideband low noise amplifier. In this figure, the pole $P_2$ and $P_3$ are very close to $\omega_{p2}$ and $\omega_{p3}$ for a very large feedback inductance $L_1$, in other words, the pole $P_2$ and $P_3$ are on the negative real number axis due to a very large feedback inductance $L_1$. Besides, $P_4$ is a newly generated pole close to the origin as the feedback inductance $L_1$ is reduced. Subsequently, the pole $P_3$ encounters $P_4$ and then they diverge toward the imaginary number axis. Additionally, the pole $P_3$ and $P_4$ are complex and conjugate because a very small value of $L_1$ is adopted, and they are used to determine gain bandwidth. Moreover, as the frequency of the pole $P_3$ and $P_4$ are larger than the frequency of the zero $Z_1$, and the frequency of the pole $P_2$ is much larger than the frequency of the pole $P_3$ and $P_4$, the effect of pole $P_2$ is negligible.

Figure 5:
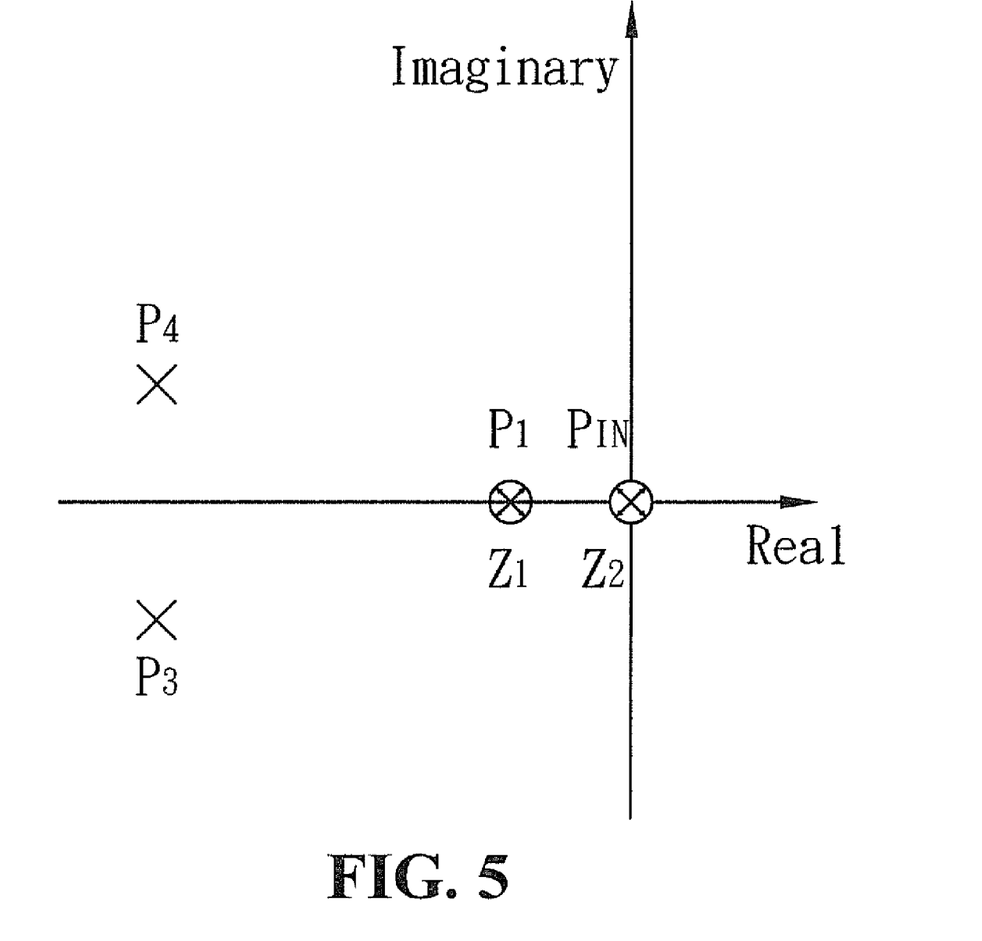
FIG. 5 illustrates the relative position of the zero and poles of the ultra-wideband low noise amplifier.

Subsequently, the buffer amplifier 14 is connected to the output of inductive-feedback amplifier 13, and there is a new pole and a zero $Z_2$ generated in the circuit of the buffer amplifier 14. The zero $Z_2$ is on the origin (as shown in FIG. 5) so the gain bandwidth is extended by zero-pole cancellation of the zero $Z_2$ and pole $P_{IN}$. When the value of the newly generated pole is larger than the values of pole $P_3$ and $P_4$, the largest flatness gain could be utilized to design the pole $P_3$ and $P_4$. Alternatively, when the values of the newly generated pole, pole $P_3$ and pole $P_4$ are approximate, it is necessary to increase the imaginary number values of $P_3$ and $P_4$, corresponding to the imaginary number axis, to obtain larger gain to compensate the effect of the newly generated pole.

Figure 7:
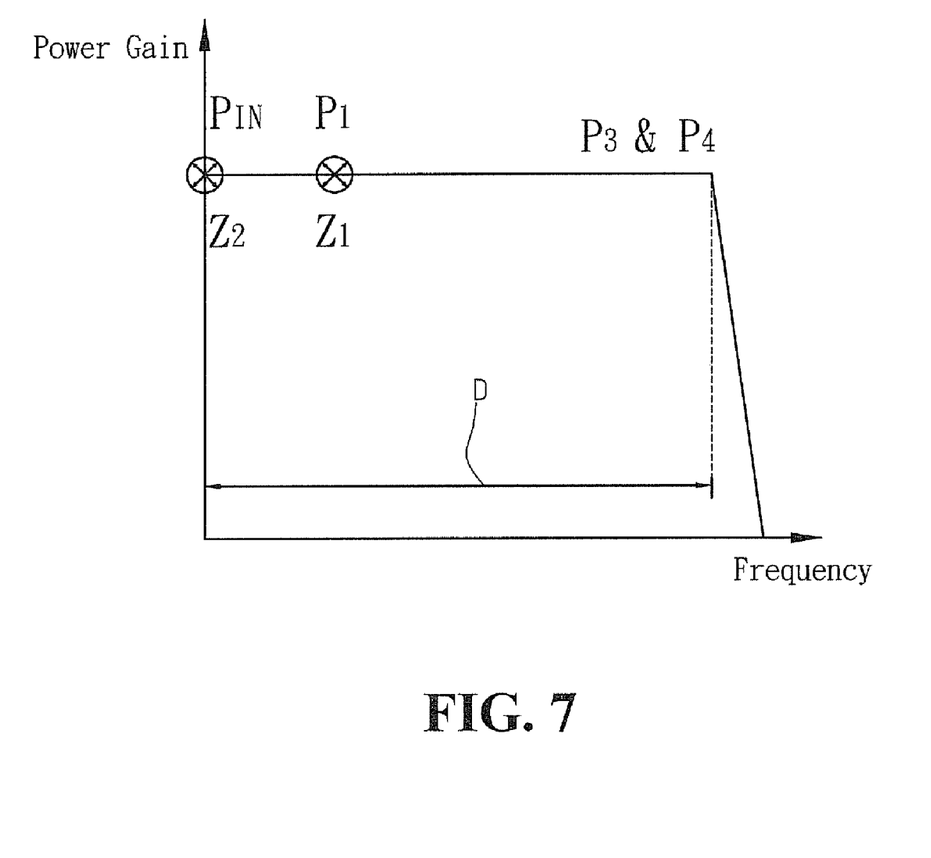
FIG. 7 illustrates the corresponding frequency response of the ultra-wideband low noise amplifier.

With reference to FIG. 7 showing the corresponding frequency response of the ultra-wideband low noise amplifier. By the method mentioned above, the corresponding frequency response is obtained as illustrated in the figure, wherein D represents the UWB band of the present invention.

Figure 8:
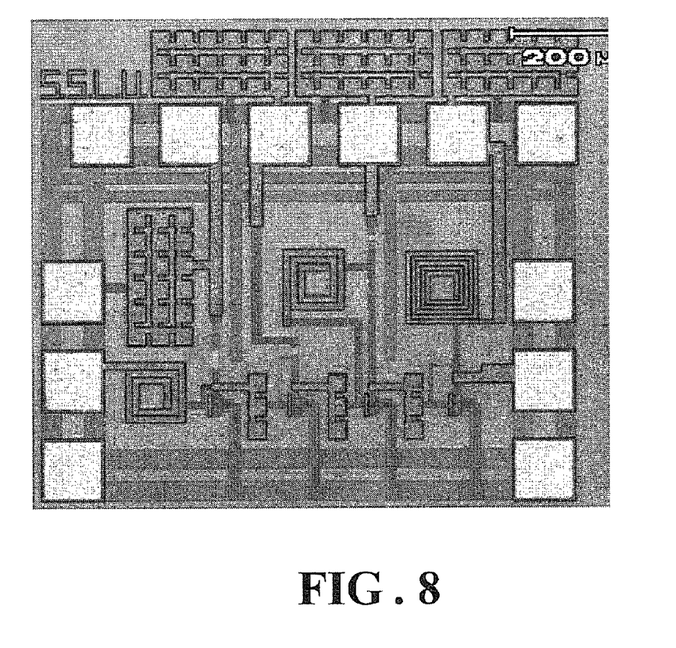
FIG. 8 illustrates the chip of the ultra-wideband low noise amplifier.

Referring to FIG. 8 exhibiting the chip of the ultra-wideband low noise amplifier of the present invention. The input impedance matching of the chip is between 3 $GH_Z$ and 10.6 $GH_Z$, and the feedback inductance $L_1$ is 0.6 nH. The noise and scattering parameters were measured on wafer using an automated NP5 measurement system from ATN Microwave Inc. The SiGe ultra-wideband low noise amplifier was biased at 2.74 mA and 1.5V, 4.88 mA and 1.7 V, 4.3 mA and 1.7 V, and 6.1 mA and 1.0 V for the first, second, third and fourth stage, respectively. That is, the power consumption is 25.8 mW.

Figure 9:
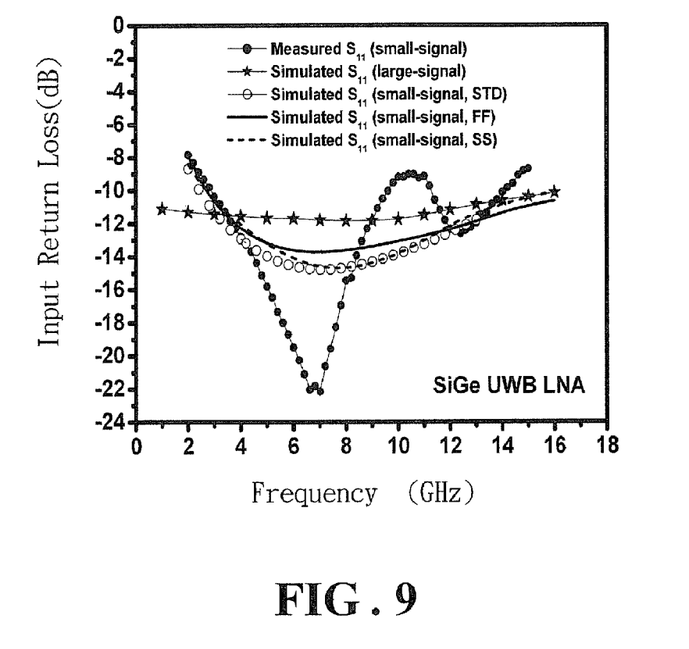
FIG. 9 illustrates measured and simulated values of input impedance matching.

Furthermore, please refer to FIG. 9 to illustrate measured and simulated values of input impedance matching. The figure shows the input impedance matching measured under different situations such as small-signal, large-signal, small-signal-standard corner (STD), small-signal-fast fast corner (FF) and small-signal-slow slow corner (SS). As shown in the figure, the input return loss (measured $S_{11}$) is below −10 dB for frequency from 3 GHz to 14 GHz (except for a small range from 10 GHz to 11 GHz which is below −9 dB), indicating a very broadband input matching characteristic.

Figure 10:
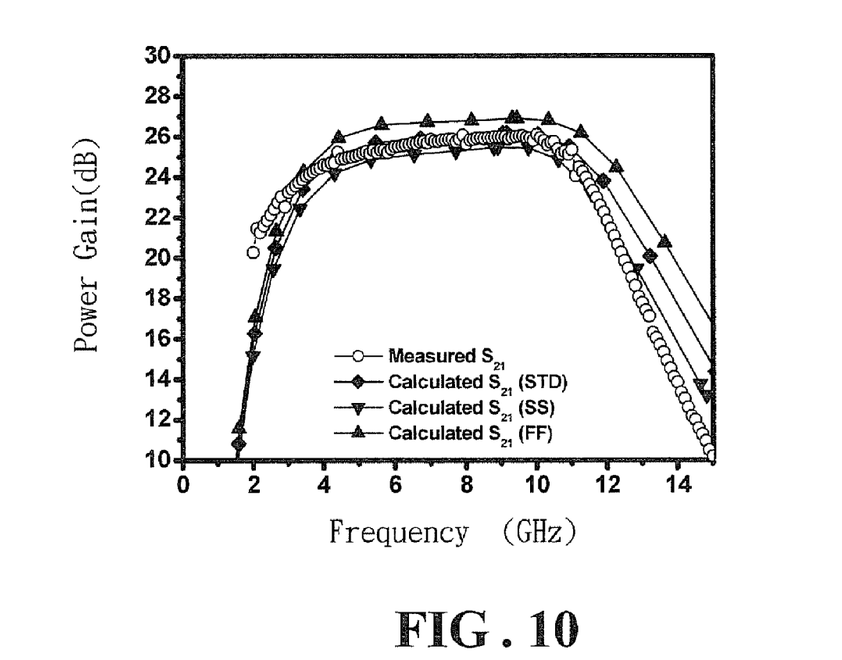
FIG. 10 illustrates measured and calculated values of power gain.
Figure 11:
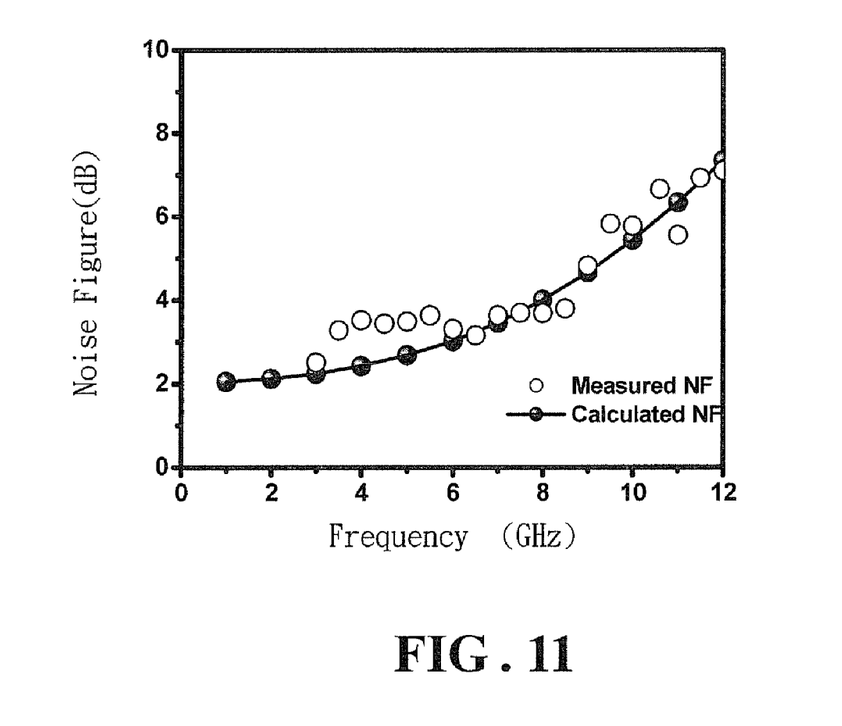
FIG. 11 illustrates measured and calculated values of noise figure.

With reference to FIG. 10 illustrating measured and calculated values of power gain. The figure shows that the amplifier of the invention has high power gain ($S_{21}$) under different situations such as STD, FF and SS. The power gain ($S_{21}$) is 24.5±1.5 dB. The bandwidth is 8.6 $GH_Z$ (3-11.6 $GH_Z$). Subsequently, please refer to FIG. 11 to illustrate measured and calculated values of noise figure. As shown in the figure, the measured NF values are very close to the calculated NF values, and the consistency between the measured ones and the calculated ones verifies that the ultra-wideband low noise amplifier is able to generate low noise figure.

Figure 12:
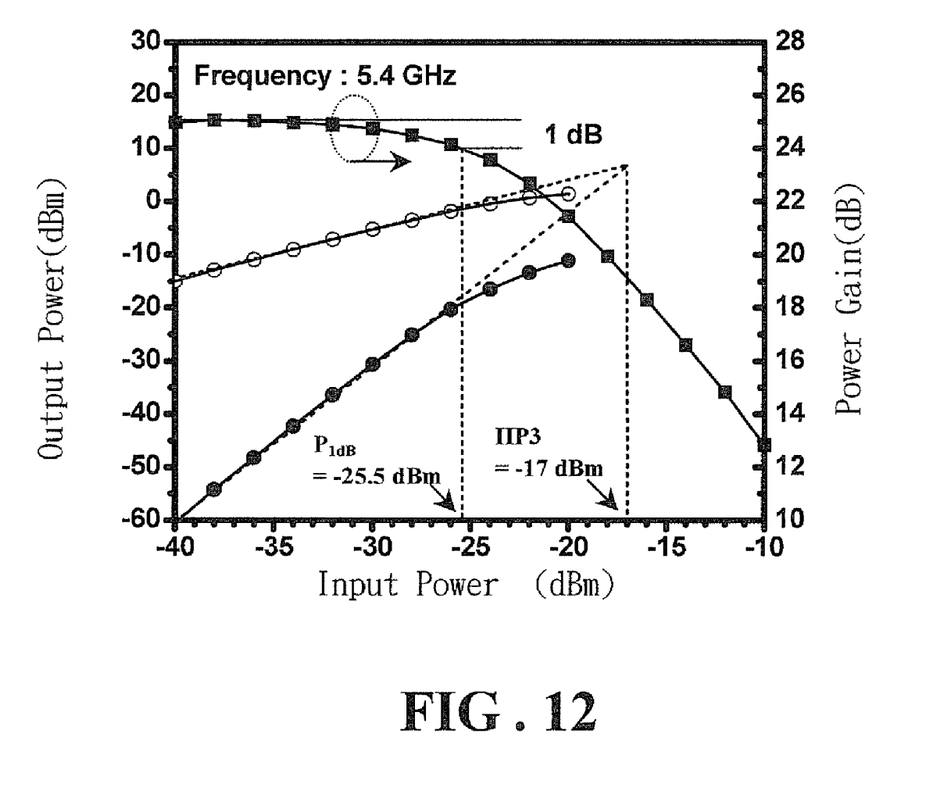
FIG. 12 illustrates phase linearity of the ultra-wideband low noise amplifier.

Furthermore, referring to FIG. 12 illustrating phase linearity of the ultra-wideband low noise amplifier of the present invention. The low noise amplifier further achieves IIP3 of −18, −17, and −18 dBm at 3, 5.4 and 10 GHz, respectively, which conform well with those (−18.3, −16.1, and −15.7 dBm at 3, 5.4, and 10 GHz, respectively) calculated by the following equation:

$$IIP3 \approx \frac{IIP3, 4}{G_1 \cdot G_2 \cdot G_3} \approx \frac{4V_T^2/R_{S3}}{G_1 \cdot G_2 \cdot G_3},$$

or $$IIP3 \text{ (in } dBm) \approx \frac{4V_T^2}{R_{S3}} \text{(in } dBm) - G_1 \cdot G_2 \cdot G_3 \text{(in dB)}$$

$$= \frac{4V_T^2}{R_{S3}} \text{(in } dBm) - G \text{(in dB)} + G_4 \text{(in dB)}$$

in which $G_1$, $G_2$, $G_3$ and $G_4$ are the gain of the first, second, third and fourth stage, respectively. In addition, the low noise amplifier achieves $P_{1\,dB}$ of −27, −25.5, and −26 dBm at 3, 5.4, and 10 GHz, respectively, which conform well with those (−27.9, −25.7, and −25.3 dBm at 3, 5.4, and 10 GHz, respectively) calculated by the following equation:

$$P_{1dB} \approx IIP3 - 9.6 \text{ dB}$$

Thus, the measured IIP3 and $P_{1\,dB}$ characteristics of the SiGe HBT ultra-wideband low noise amplifier at 5.4 GHz is shown in FIG. 12 to illustrate the phase linearity.

Figure 13:
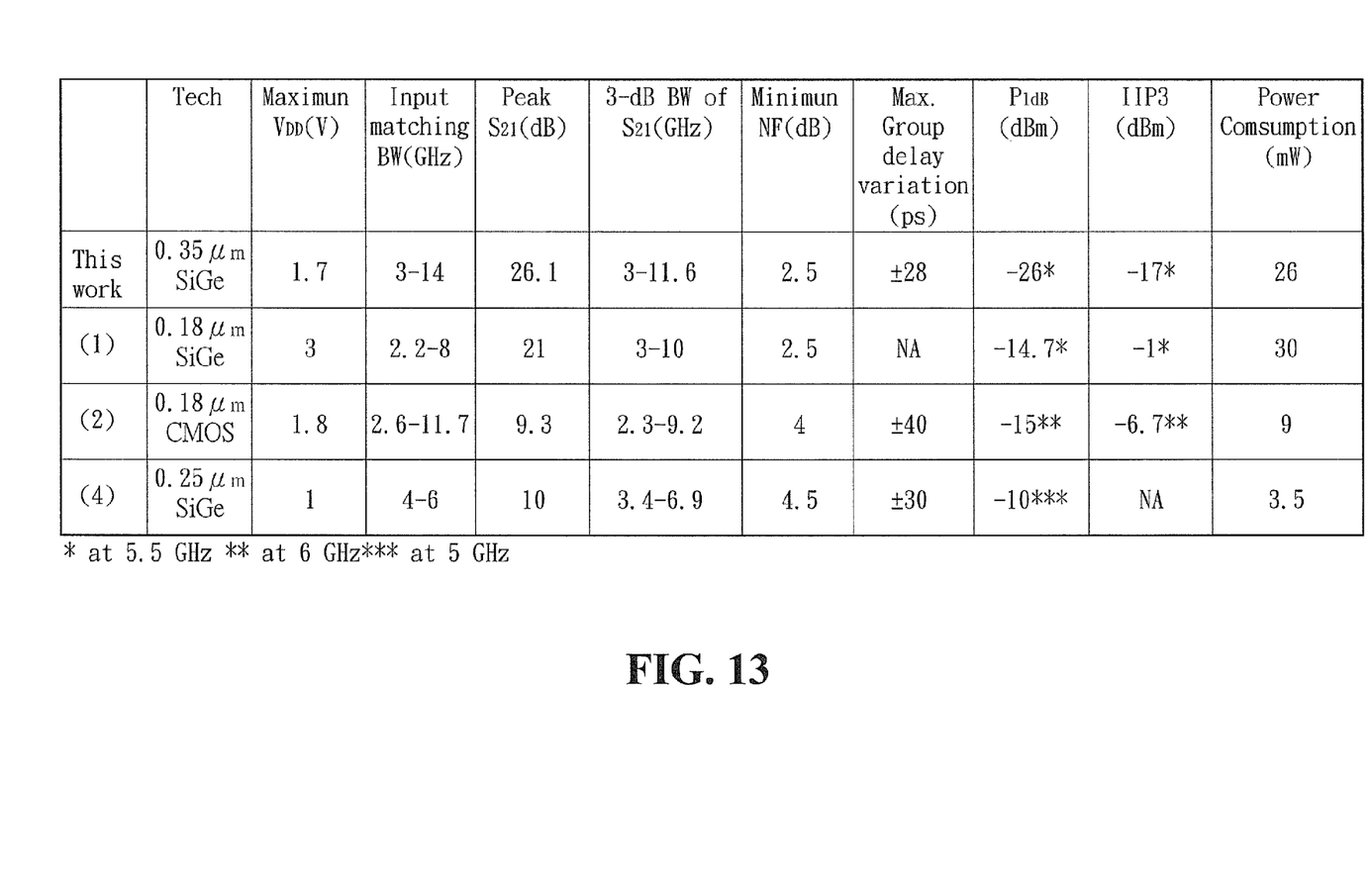
FIG. 13 illustrates a summary of the embodiment along with other reported state-of the-art ultra-wideband low noise amplifiers.

Moreover, with reference to FIG. 13 to exhibit a summary of the embodiment along with other reported state-of-the-art ultra-wideband low noise amplifiers. Based on this figure, it is found that UWB LNAs with gain higher than 20 dB ([1] and this work) consume more power (30 mW in [1] and 26 mW in this work) than those with gain near 10 dB. Clearly, if a more advanced SiGe HBT technology is adopted and a lower $S_{21}$ is specified, such as those in [4], the power consumption of our proposed LNA is expected to be largely reduced. Additionally, compared with 0.18 µm SiGe HBT, 0.18 µm CMOS and 0.25 µm SiGe HBT, the ultra-wideband low noise amplifier of the present invention has better power gain and bandwidth, and the chip of the preferred embodiment is merely 380 µm×220 µm.

As above, the transistors are the active components of the four amplifiers, and the transistor is n-MOSFET, p-MOSFET, BJT, MESFET, pHEMT or HBT. In the preferred embodiment, the HBT is adopted as the transistor 115, 124, 134 and 143.

Moreover, the ultra-wideband low noise amplifier 1 is applied in ultra wideband communication product or wireless communication network, and the amplifier 1 is manufactured by complementary CMOS process, Si-Bipolar process, Bi-CMOS process, MESFET process, pHEMT process or HBT process. In the preferred embodiment, the amplifier 1 is manufactured by the 0.35 µm SiGe HBT process.

Additionally, there are capacitors disposed respectively in the first, second and third stage i.e. the capacitive-feedback amplifier, resistive-feedback amplifier and inductive-feedback amplifier, wherein the capacitor is a MIM Capacitor, PN Junction Capacitor or MOS Capacitor.

Moreover, there are resistors and inductors installed in the four stages, wherein the resistor is a polysilicon resistor or N-well resistor, and the inductor is disposed on chip or a metal wire inductor linked to chip externally.

While the invention has been particularly shown and described with reference to the preferred embodiments thereof, these are, of course, merely examples to help clarify the invention and are not intended to limit the invention. It will be understood by those skilled in the art that various changes, modifications, and alterations in form and details may be made therein without departing from the spirit and scope of the invention, as set forth in the following claims.

What is claimed is:

1. An ultra wideband low noise amplifier (UWB LNA), comprising:
   a capacitive-feedback amplifier including a transistor taken as active component;
   a resistive-feedback amplifier, connected to the output of capacitive-feedback amplifier, including a transistor taken as active component;
   an inductive-feedback amplifier, connected to the output of resistive-feedback amplifier, including a transistor taken as active component; and
   a buffer amplifier, connected to the output of the inductive-feedback amplifier, including a transistor taken as active component;
   wherein the basic configuration of the amplifiers is a common-emitter amplifier.

2. The ultra wideband low noise amplifier of claim 1, wherein the transistor is a n-type metal oxide semiconductor field-effect transistor (n-MOSFET), p-type metal oxide semiconductor field-effect transistor (p-MOSFET), Bipolar Junction Transistor (BJT), Metal-Semiconductor Field Effect Transistor (MESFET), pseudomorphic High Electron Mobility Transistor (pHEMT) or Heterostructure Bipolar Transistor (HBT).

3. The ultra wideband low noise amplifier of claim 1, wherein the collector of the transistor of the capacitive-feedback amplifier connected to the power via a loading resistor, the emitter ground, the base connected to the input of the capacitive-feedback amplifier via an inductor, the collector connected to the output of the capacitive-feedback amplifier via a capacitor, and a feedback capacitor disposed between the base and collector of the transistor for input impedance matching up to 50 ohm.

4. The ultra wideband low noise amplifier of claim 1, wherein the base of the transistor of the resistive-feedback amplifier connected to the output of capacitive-feedback amplifier, the collector connected to the power via a loading resistor, the emitter ground, the collector connected to the output of the resistive-feedback amplifier via a capacitor, and a feedback resistor disposed between the base and collector of the transistor for bandwidth extension.

5. The ultra wideband low noise amplifier of claim 1, wherein the base of the transistor of the inductive-feedback amplifier connected to the output of resistive-feedback amplifier, the collector connected to the power via a loading resistor, the emitter ground, the collector connected to the output of the inductive-feedback amplifier via a capacitor, and a feedback inductor disposed between the base and collector of the transistor for bandwidth extension.

6. The ultra wideband low noise amplifier of claim 1, wherein the base of the transistor of the buffer amplifier connected to the output of inductive-feedback amplifier, the collector connected to the power via a loading inductor, the emitter ground, a feedback resistor disposed between the base and collector of the transistor, and the collector taken as the output of the buffer amplifier.

7. The ultra wideband low noise amplifier of claim 1, wherein the ultra wideband low noise amplifier is used in ultra wideband communication product or wireless communication network.

8. The ultra wideband low noise amplifier of claim 1, wherein the ultra wideband low noise amplifier is manufactured by complementary Metal-Oxide-Semiconductor (CMOS) process, Si-Bipolar process, Bi-CMOS process, Metal-Semiconductor Field Effect Transistor (MESFET) process, pseudomorphic High Electron Mobility Transistor (pHEMT) process or Heterostructure Bipolar Transistor (HBT) process.

9. The ultra wideband low noise amplifier of claim 3, wherein the capacitor is a Metal-Insulator-Metal Capacitor (MIM Capacitor), PN Junction Capacitor or Metal-Oxide Semiconductor Capacitor (MOS Capacitor).

10. The ultra wideband low noise amplifier of claim 3, wherein the resistor is a polysilicon resistor or N-well resistor.

11. The ultra wideband low noise amplifier of claim 3, wherein the inductor is disposed on chip or a metal wire inductor linked to chip externally.

12. A method for transforming an ultra wideband low noise amplifier comprising the steps of:
- matching input impedance by a capacitive-feedback amplifier;
- extending bandwidth by
  - connecting a resistive-feedback amplifier to the out of capacitor-feedback amplifier;
  - connecting an inductive-feedback amplifier to the output of resistive-feedback amplifier; and
  - connecting a buffer amplifier to the output of inductive-feedback amplifier;
- whereby the UWB LNA circuit is formed to achieve pole-zero cancellation to extend bandwidth.

13. The method for transforming an ultra wideband low noise amplifier of claim 12, the capacitive-feedback amplifier further includes a transistor taken as active component, wherein the collector of the transistor connected to the power via a loading resistor, the emitter ground, the base connected to the input of the capacitive-feedback amplifier via an inductor, the collector connected to the output of the capacitive-feedback amplifier via a capacitor, and a feedback capacitor disposed between the base and collector of the transistor.

14. The method for transforming an ultra wideband low noise amplifier of claim 12, the resistive-feedback amplifier further includes a transistor taken as active component, wherein the base of the transistor connected to the output of capacitive-feedback amplifier, the collector connected to the power via a loading resistor, the emitter ground, the collector connected to the output of the resistive-feedback amplifier via a capacitor, and a feedback resistor disposed between the base and collector of the transistor.

15. The method for transforming an ultra wideband low noise amplifier of claim 12, the inductive-feedback amplifier further includes a transistor taken as active component, wherein the base of the transistor connected to the output of resistive-feedback amplifier, the collector connected to the power via a loading resistor, the emitter ground, the collector connected to the output of the inductive-feedback amplifier via a capacitor, and a feedback inductor disposed between the base and collector of the transistor.

16. The method for transforming an ultra wideband low noise amplifier of claim 12, the buffer amplifier further includes a transistor taken as active component, wherein the base of the transistor connected to the output of inductive-feedback amplifier, the collector connected to the power via a loading inductor, the emitter ground, a feedback resistor disposed between the base and collector of the transistor, and the collector taken as the output of the buffer amplifier.

17. The ultra wideband low noise amplifier of claim 4, wherein the capacitor is a Metal-Insulator-Metal Capacitor (MIM Capacitor), PN Junction Capacitor or Metal-Oxide Semiconductor Capacitor (MOS Capacitor).

18. The ultra wideband low noise amplifier of claim 5, wherein the capacitor is a Metal-Insulator-Metal Capacitor (MIM Capacitor), PN Junction Capacitor or Metal-Oxide Semiconductor Capacitor (MOS Capacitor).

19. The ultra wideband low noise amplifier of claim 4, wherein the resistor is a polysilicon resistor or N-well resistor.

20. The ultra wideband low noise amplifier of claim 5, wherein the resistor is a polysilicon resistor or N-well resistor.

21. The ultra wideband low noise amplifier of claim 6, wherein the resistor is a polysilicon resistor or N-well resistor.

22. The ultra wideband low noise amplifier of claim 4, wherein the inductor is disposed on chip or a metal wire inductor linked to chip externally.

23. The ultra wideband low noise amplifier of claim 5, wherein the inductor is disposed on chip or a metal wire inductor linked to chip externally.

24. The ultra wideband low noise amplifier of claim 6, wherein the inductor is disposed on chip or a metal wire inductor linked to chip externally.

* * * * *